Figure 1:
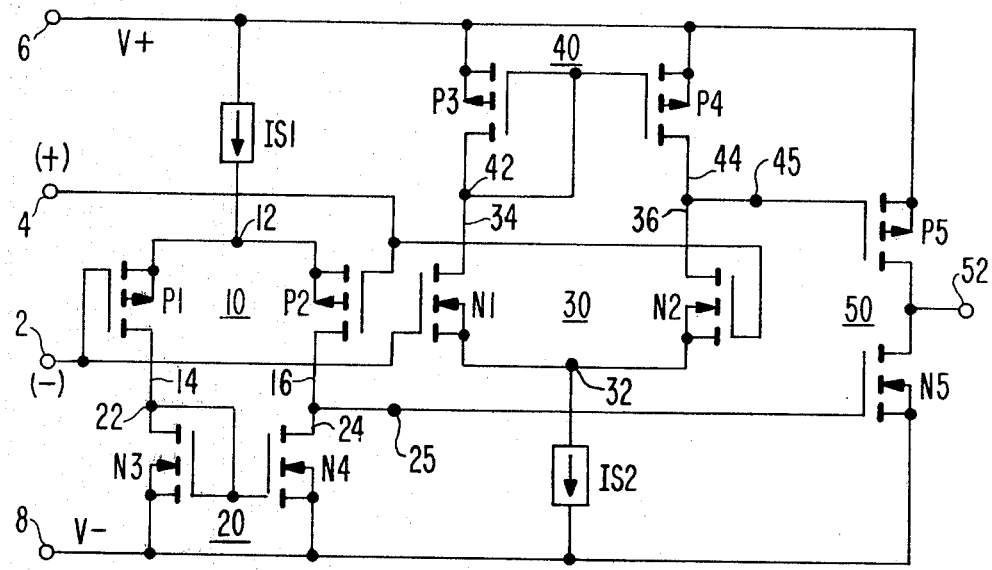

United States Patent [19]
Hoover

[11] 4,333,058
[45] Jun. 1, 1982

[54] OPERATIONAL AMPLIFIER EMPLOYING COMPLEMENTARY FIELD-EFFECT TRANSISTORS

[75] Inventor: Merle V. Hoover, Flemington, N.J.

[73] Assignee: RCA Corporation, New York, N.Y.

[21] Appl. No.: 144,291

[22] Filed: Apr. 28, 1980

[51] Int. Cl.³ .......................... H03F 3/45; H03F 3/16
[52] U.S. Cl. .................................. 330/253; 330/255; 330/257
[58] Field of Search ...................... 330/253, 255, 257

[56] References Cited

U.S. PATENT DOCUMENTS

| | | | |
|---|---|---|---|
| 3,737,797 | 6/1973 | Amemiya | 330/30 D |
| 3,786,179 | 1/1974 | Mouri et al. | 178/5.4 SD |
| 4,004,245 | 1/1977 | Ochi et al. | 330/30D |
| 4,048,575 | 9/1977 | Musa | 330/22 |
| 4,152,663 | 5/1979 | Van de Sande | 330/257 |
| 4,267,517 | 5/1981 | Iida et al. | 330/253 |
| 4,284,958 | 8/1981 | Pryor et al. | 330/253 |
| 4,284,959 | 8/1981 | Heagerty et al. | 330/253 |

OTHER PUBLICATIONS

*Linear Integrated Circuit D.A.T.A. Book,* Edition 23, 1980, See A358, p. 188.

Primary Examiner—James B. Mullins
Assistant Examiner—Gene Wan
Attorney, Agent, or Firm—Eugene M. Whitacre; Paul J. Rasmussen; Clement A. Berard, Jr.

[57] ABSTRACT

An operational amplifier includes first and second differential-input amplifiers of complementary conductivity type, each such differential-input amplifier including first and second transistors in long-tailed pair configuration having their drains connected to third and fourth transistors connected in current mirror amplifier configuration. An output amplifier includes a pair of complementary conductivity type transistors, each in common-source configuration, to supply signals to an output terminal. One output of the long-tailed pair and the output connection of the current mirror amplifier in the first differential-input amplifier directly connect to the gate of the first common-source amplifier. One output connection of the long-tailed pair and the output connection of the current mirror amplifier of the second differential-input amplifier directly connect to the gate input of the other common-source amplifier. A tail current supply for each long-tailed pair establishes its quiescent operating point.

11 Claims, 5 Drawing Figures

OPERATIONAL AMPLIFIER EMPLOYING COMPLEMENTARY FIELD-EFFECT TRANSISTORS

This invention relates to operational amplifiers and in particular to such amplifiers employing complementary field-effect transistors (FETs) and having differential-input amplifier stages of complementary conductivity types with input circuits connected in parallel.

U.S. Pat. No. 4,152,663 entitled Amplifier Arrangement, issued to Van de Sande on May 1, 1979, describes an operational amplifier employing field-effect transistors. Van de Sande employs a differential-input amplifier coupled to a current mirror amplifier (CMA) which, as is common in the art, serves as a differential-to-single-ended converter. The signal current output therefrom drives a further current mirror amplifier to supply output current. Van de Sande further employs a second group of circuits identical in configuration to those just described but in which the transistors are of a complementary conductivity type. The input circuits of Van de Sande's differential-input amplifiers are connected in parallel to receive input signals and output signals are available at an interconnection of the output connections of the corresponding further current mirror amplifiers.

Circuits of the type described by Van de Sande have several shortcomings however. Firstly, in order to provide the complementary CMA class-B output stage it is necessary that the input circuits of those CMAs be connected across the outputs of the differential-to-single ended converter of the differential-input stage. Because those input circuits exhibit low resistance as compared to the output resistances of the differential-to-single-ended converters, the voltage gain is substantially reduced. Secondly, because the complementary CMA output circuits receive only signal current at their respective inputs, the magnitude of output current available from the amplifier is correspondingly limited. Finally, in the Van de Sande type amplifier, further CMAs are needed to provide bias current for the differential-input amplifiers, as are resistors to establish input currents for those CMAs.

Thus, the known circuits exhibit substantially reduced voltage gain to achieve low idling current in the output stage, exhibit limited output current drive capability, are complex, and require resistive elements. On the other hand, the embodiment of the present invention described herein avoids problems of reduced voltage gain and the need for resistors and at the same time provides the advantage of simplicity.

The present invention comprises first and second FET differential-input amplifier means of complementary conductivity types, each having a pair of FETs in long-tailed pair connection each having a respective tail current supply connected to its tail connection, the inputs of the differential-input amplifier means being connected in parallel. Each differential-input amplifier means further includes current mirror amplifying means of complementary conductivity type to the long-tailed pair to which it connects, its input circuit being connected to a first output of its associated long-tailed pair. The output circuit of each current mirror amplifying means connects to a second output of its associated long-tailed pair at an output connection of the respective differential-input amplifier means. An output amplifier includes a pair of field-effect transistors of complementary conductivity type, each connected in common-source amplifier configuration and having their respective drain electrodes connected for providing output signals. The respective output connections of the differential-input amplifier means directly connect to the gate of a respective one of the first and second field-effect transistors and are not shunted by elements that would undesirably reduce the voltage gain of the differential-input amplifier means.

In the drawings:

FIG. 1 is a schematic diagram of an embodiment including the present invention; and FIGS. 2, 3, 4 and 5 are schematic diagrams of alternative embodiments of a portion of the amplifier of FIG. 1.

The operational amplifier of FIG. 1 receives input signals at inverting input terminal 2 and non-inverting input terminal 4 and supplies signals responsive to the difference between those input signals at output terminal 52.

A differential-input amplifier stage including long-tailed pair (LTP) 10 and current mirror amplifier (CMA) 20 receives input signals from terminals 2 and 4 and supplies signals responsive to the difference therebetween at output connection 25.

Long-tailed pair 10 includes P-channel FETs P1 and P2 having their sources connected to tail connection 12 for receiving tail current from current supply IS1. Input signals from terminal 2 are applied to the gate of P1 while signals from terminal 4 are applied to the gate of FET P2. Signals are supplied from first 14 and second 16 output connections of LTP 10 at the drains of P1 and P2 respectively to CMA 20.

N-channel FETs N3 and N4 in CMA 20 respectively connect its input connection 22 and its output connection 24 to relatively negative operating potential at supply terminal 8. A direct connection between input 22 and the gate of N3 maintains the potential therebetween in a predetermined relationship, i.e., 0 volts, for making N3 serve as the input circuit of CMA 20. N4 serves as the output circuit 24 of CMA 20 supplying signals at connection 25.

A second differential-input amplifier including LTP 30, CMA 40 and tail current supply IS2 is symmetrical to and operates in like manner to LTP 10, CMA 20, and current supply IS1 described above. The transistors used therein are of complementary conductivity type to that of the corresponding ones in the previously described circuit, however, and the polarity sense of the operating potentials, as well as that of the tail currents, are interchanged. First and second inputs to LTP 30 at the respective gates of FETs N1 and N2 connect in parallel with the first and second inputs of LTP 10 at the gates of P1 and P2, respectively. First and second outputs 34 and 36 of LTP 30 connect to the input connection 42 and output connection 44, respectively, of CMA 40 which includes P-channel FETs P3 and P4.

Output amplifier 50 includes a pair of complementary conductivity FETs P5 and N5 the drains of which connect to output terminal 52. FET N5 is in common-source amplifier configuration with its source directly connected to supply terminal 8, and FET P5 is in common-source amplifier configuration with its source directly connected to supply terminal 6. Amplifier 50 provides the advantage that output signals therefrom can use the entire range of voltages between V+ at terminal 6 and V− at terminal 8 thereby providing full rail-to-rail output swing.

Signals at output connection 25, responsive to the difference between the signals at input terminals 2 and 4, are amplified by the voltage gain of LTP 10 in combination with CMA 20. That voltage gain is determined by the transconductances of FETs P1, P2, N3 and N4 and is of substantial magnitude. Because the gate of FET N5 exhibits high input resistance as compared to the resistance at the outputs of LTP 10 and CMA 20 and is directly connected thereto, the substantial voltage gain at connection 25 is not reduced by the coupling of signals to output amplifier 50.

Similarly, LTP 30 and CMA 40 exhibit substantial voltage gain between input terminals 2 and 4 and output connection 45, FET P5 exhibits high input resistance as compared to the output resistance at connection 45, and the substantial voltage gain exhibited is similarly not reduced by the direct coupling of signals between connection 45 and output amplifier 50.

The operational amplifier of FIG. 1 is operable with input signals at terminals 2 and 4 having a common-mode voltage component that may be beyond the potentials at supply terminals 6 and 8. For common-mode voltage components in a range between the potentials at terminals 6 and 8, differential-mode input signals are amplified by the signal path including LTP 10, CMA 20 and FET N5 and by the signal path including LTP 30, CMA 40 and FET P5, the respective signals being combined at output terminal 52.

When that common-mode voltage component approaches or goes beyond the potential V+ at supply terminal 6, the signal path including LTP 30, etc. remains operative supplying amplified signals to output terminal 52. When that common-mode voltage component approaches or goes beyond the potential V− at terminal 8, the signal path including LTP 10, etc. remains operative supplying amplified signals to terminal 52. For common-mode voltage components of the latter two ranges, the gain of amplifier between inputs 2, 4 and output 52 decreases by a factor of about two. That decrease is normally not deleterious to performance, especially when direct-coupled degenerative feedback is employed, for example, as by a resistive connection between terminal 52 and terminal 2.

In operational amplifiers, it is necessary to control the gain as a function of frequency to avoid undesirable oscillatory responses when such amplifiers are employed with feedback connections. Pole capacitors (not shown) are connected between the respective drain-gate electrodes of FETs N5 and P5 to take advantage of the Miller effect for that purpose. As a direct result of the high resistance at the respective gates of N5 and P5, the values of the capacitors and therefore their physical sizes, are advantageously small. That feature is of particular advantage when the amplifier of FIG. 1 is fabricated as a monolithic integrated circuit where small chip size tends to provide advantages of reduced cost and improved production yield.

Figure 2:
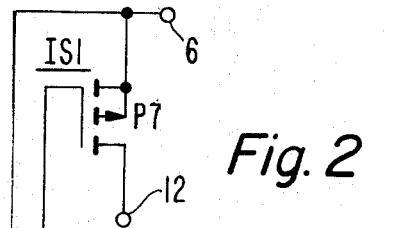

FIG. 2 shows an embodiment of current supplies IS1 and IS2 wherein drain current from complementary FETs P7 and N7 is supplied to tail connections 12 and 32 respectively. Where FETs P7 and N7 are enhancement-mode devices, their sources connect to supply terminals 6 and 8, respectively, while their gates connect to opposite supply terminals 8 and 6, respectively, for making them operate as constant current sources. When the current sources of FIG. 2 are used in conjunction with the amplifier of FIG. 1, an extremely simplified amplifier, requiring only twelve transistors and no resistors, results. The advantage of such amplifiers is two-fold—firstly, the large area requirements of integrated circuit resistors and the difficulty of obtaining stable resistance values are avoided. Secondly, in a monolithic integrated circuit embodiment, the reduced complexity and chip area results in lower costs and higher production yields.

Figure 3:
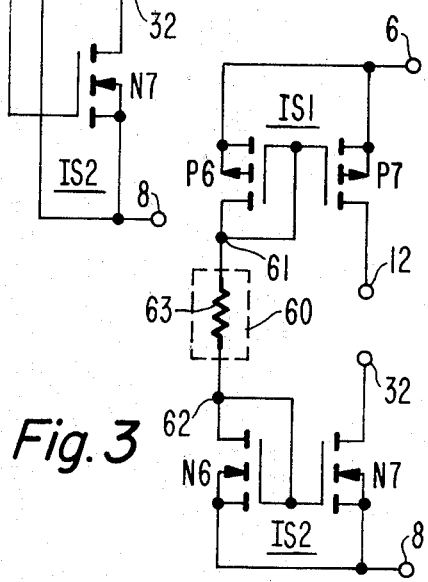

In FIG. 3, FETs P6 and N6 cooperate with P7 and N7 to form CMAs IS1 and IS2, respectively. The current supplied to tail connections 12 and 32 is determined by the operating potential between supply terminals 6 and 8 and the conductance characteristics of element 60. Resistor 63, for example, conducts current between input connections 61 and 62. Element 60 could also be a controlled conductance device, for example, a FET with its drain-source conduction path connected between 61 and 62 whereby the tail currents are responsive to the signals applied to the gate of that FET.

Figure 4:
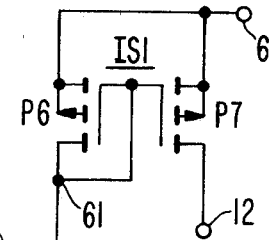

In FIG. 4, a control signal applied at connection 64 causes FETs N6, N7 and N8 connected as a CMA to supply current from the drain of N7 to tail connection 32 and current from the drain of N8 to input connection 61. CMA IS1, formed by FETs P6 and P7, then supplies a related current to tail connection 12. Due to the symmetry of the circuits described, one could, of course, interchange N and P-channel devices and the polarity of operating potentials so that the control signal would be applied to generate IS1 directly while IS2 is generated responsive to a further output current from IS1.

When current supplies IS1 and IS2 in accordance with FIG. 4 are employed, the amplifier of FIG. 1 is usable as a variable gain amplifier. The gain exhibited between input terminals 2, 4 and output terminal 52 is proportional to the control signal current applied to terminal 64. As a result thereof, the amplifier can be employed as an amplitude modulator wherein the differential signal at terminals 2,4 is modulated by the signals applied at control terminal 64. Furthermore, selective application of control current to terminal 64 effectively provides gating of the signal paths between terminals 2, 4 and 52.

Figure 5:
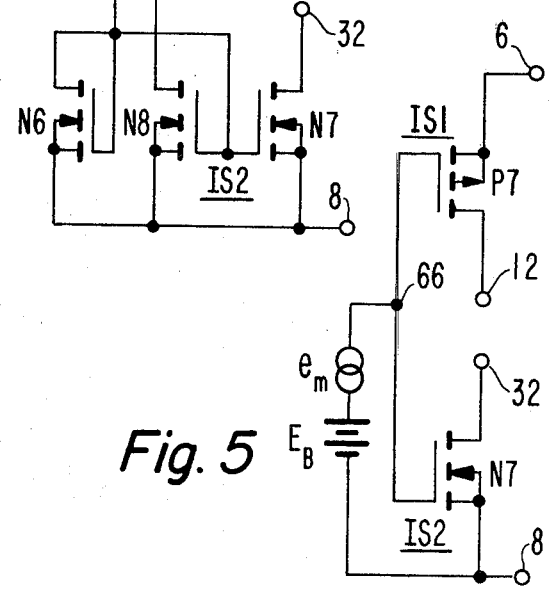

FIG. 5 shows an alternative embodiment of tail current supplies IS1 and IS2 for modulating the signal at output terminal 52 of the amplifier of FIG. 1. The tail currents supplied by FETs P7 and N7 to tail connections 12 and 32, respectively, are responsive to the control potential applied at control connection 66. That control potential could include a fixed portion $E_B$ and a variable portion $e_m$.

When the control potential at connection 66 moves towards V+ at terminal 6, tail current at connection 12 decreases and tail current at connection 32 increases in complementary manner, the net effect being to cause the potential at output 52 to tend towards potential V+ at terminal 6. On the other hand, when the potential at connection 66 moves towards V− at terminal 8, that at terminal 52 tends to move towards V− at terminal 8. This embodiment is therefore useful for combining signals because the signal at output 52 is responsive to the sum of the signals applied between terminals 2 and 4 and those applied at connection 66.

In a preferred embodiment of the invention, it is desirable that transistors serving like functions exhibit similar transconductance characteristics, for example, enhancement-mode FETs P1 and P2 of LTP 10 are preferably matched as are FETs N1 and N2 of LTP 30. Similar matching is desirable between FETs N3 and N4 of CMA 20 and FETs P3 and P4 of CMA 40. It is further preferred that complementary FETs also exhibit similar transconductance characteristics, for example, as between FETs P1, P2, N1 and N2, or as between FETs P5 and N5 of output amplifier 50, or as between FETs P7 and N7 in the current sources of FIG. 2. Matching the transconductance characteristics of the respective FETs is easily achieved when circuits embodying the invention are constructed using an integrated circuit technology such as metal-oxide-semiconductor, field-effect transistor (MOS-FET) technology.

Further alternative embodiments of the present invention will be apparent to one skilled in the art of design when armed with the teachings of this disclosure. For example, CMAs 20 and 40 may be implemented using alternative forms of CMAs known to those skilled in the art. Furthermore, each differential-input amplifier stage could employ cascode-connected further transistors in the respective output connections of LTPs 10 and 30 and CMAs 20 and 40 for substantially increasing their output resistance and thereby substantially increasing their voltage gain. Having described this invention and alternative embodiments thereof, the claims herebelow should be liberally construed to include the full scope and spirit of the invention.

What is claimed is:

1. An amplifying circuit comprising:
   first and second supply terminals for receiving relatively positive and relatively negative operating potentials, respectively;
   inverting and non-inverting input terminals for receiving input signals thereat, and a signal output terminal;
   a first differential-input amplifier means including:
   first and second field-effect transistors, of P-channel conductivity type and in long-tailed pair connection, having respective gate electrodes to which said inverting and non-inverting input terminals respectively connect, having respective source electrodes connected to a tail connection, and having respective drain electrodes,
   means for supplying a first tail current connected between the tail connection of said first differential-input amplifier means and said first supply terminal,
   first current mirror amplifying means having an input and an output connection, and having a common connection to which said second supply terminal connects,
   means for connecting the input connection of said first current mirror amplifying means to the drain electrode of said first transistor, and
   an output connection of said first differential-input amplifier means at which output resistance is exhibited responsive to the connections of the output connection of said first current mirror amplifying means and the drain electrode of said second transistor thereto;
   a second differential-input amplifier including:
   third and fourth field-effect transistors, of N-channel conductivity type and in long-tailed pair connection, having respective gate electrodes to which said inverting and non-inverting input terminals respectively connect, having respective source electrodes connected to a tail connection, and having respective drain electrodes,
   means for supplying a second tail current connected between the tail connection of said second differential-input amplifier means and said second supply terminal;
   second current mirror amplifying means having an input and an output connection, and having a common connection to which said first supply terminal connects,
   means for connecting the input connection of said second current mirror amplifying means to the drain-electrode of said third transistor, and
   an output connection of said second differential-input amplifier means at which output resistance is exhibited responsive to the connections of the output connection of said second current mirror amplifying means and the drain electrode of said fourth transistor thereto;
   output amplifier means including
   first and second input connections for providing respective relatively high resistances as compared to the output resistances of the output connections of said first and second differential-input amplifier means, respectively, and
   fifth and sixth field-effect transistors of N-channel and P-channel type, respectively, each in common-source amplifier configuration having respective source electrodes directly connected to said second and first supply terminals respectively having respective drain electrodes connected to said signal output terminal, and having respective gate electrodes serving as the first and second input connections, respectively, of said output amplifier means;
   means for directly connecting the output connection of said first differential-input amplifier means to the first input connection of said output amplifier means without substantially reducing the resistance exhibited thereat; and
   means for directly connecting the output connection of said second differential-input amplifier means to the second input connection of said output amplifier means without substantially reducing the resistance exhibited thereat.

2. The amplifying circuit of claim 1 wherein said first current mirror amplifying means comprises:
   seventh and eighth field-effect transistors of N-channel conductivity type, each having source, drain and gate electrodes; the respective source electrodes of said seventh and eighth transistors connecting to the common terminal of said first current mirror amplifying means, the drain electrode of said seventh transistor serving as the input connection thereof, and the drain electrode of said eighth transistor serving as the output connection thereof; and
   means connected between the drain electrode of said seventh transistor and the respective gate electrodes of said seventh and eighth transistors for maintaining the potential therebetween in predetermined relationship; and wherein
   said second current mirror amplifying means comprises:
   ninth and tenth field-effect transistors of P-channel conductivity type, each having source, drain, and gate electrodes, the respective source electrodes of said ninth and tenth transistors connecting to the common terminal of said second current mirror amplifying means, the drain electrode of said ninth transistor serving as the input connection thereof, and the drain electrode of said tenth transistor serving as the output connection thereof; and means connected between the drain electrode of said ninth transistor and the respective gate electrodes of said ninth and tenth transistors for maintaining the potential therebetween in predetermined relationship.

3. The amplifying circuit of claim 1 or 2 wherein
said means for supplying a first tail current includes a further P-channel field-effect transistor having a drain electrode connected for supplying said first tail current, having a source electrode connected to said first supply terminal, and having a gate electrode connected to said second supply terminal; and wherein said means for supplying a second tail current includes a further N-channel field-effect transistor, having a drain electrode connected for supplying said second tail current, having a source electrode connected to said second supply terminal, and having a gate electrode connected to said first supply terminal.

4. The amplifying circuit of claim 1 or 2 further comprising:
means included in said means for supplying a first tail current for varying the first tail current responsive to a first control signal applied thereto;
means included in said means for supplying a second tail current for varying the second tail current responsive to a second control signal applied thereto.

5. The amplifying circuit of claim 4 further including means for generating the first and second control signals for maintaining a proportional relationship between the first and second tail currents.

6. The amplifying circuit of claim 4 wherein said means included in said means for supplying a first tail current is third current mirror amplifying means, having a first output circuit for supplying the first tail current, and having an input circuit to which the first control signal is applied; and
said means included in said means for supplying a second tail current is fourth current mirror amplifying means having a first output circuit for supplying the second tail current and having an input circuit to which the second control signal is applied.

7. The amplifying circuit of claim 6 further comprising means connected between the respective input circuits of said third and fourth current mirror amplifying means for generating the first and second control signals by conducting current therebetween.

8. The amplifying circuit of claim 6 wherein one of said third and fourth current mirror amplifying means includes a further output circuit which connects to the input circuit of the other of said third and fourth current mirror amplifying means for applying the corresponding one of the first and second control signals thereto.

9. The amplifying circuit of claim 4 further including means for generating the first and second control signals for maintaining a complementary relationship between the first and second tail currents.

10. The amplifying circuit of claim 9 wherein
said means included in said means for supplying a first tail current includes a further P-channel field-effect transistor having a drain electrode connected for supplying said first tail current, having a source electrode connected to said first supply terminal, and having a gate electrode; and wherein
said means included in said means for supplying a second tail current includes a further N-channel field-effect transistor, having a drain electrode connected for supplying said second tail current, having a source electrode connected to said second supply terminal, and having a gate electrode; and wherein
said means for generating the first and second control signals includes a control electrode for receiving a control potential thereat, and means connecting the respective gate electrodes of said N-channel and P-channel transistors to said control electrode.

11. The amplifying circuit of claim 10 wherein said control potential includes a fixed potential component, and a variable potential component, said fixed potential component tending to maintain the first and second tail currents at a quiescent level, and said variable potential component tending to vary said first and second tail currents in said complementary relationship.

* * * * *